(12) United States Patent
Yang

(10) Patent No.: US 8,531,210 B2
(45) Date of Patent: Sep. 10, 2013

(54) MONOLITHIC HIGH-SIDE SWITCH CONTROL CIRCUITS

(75) Inventor: Ta-Yung Yang, Taoyuan (TW)

(73) Assignee: System General Corporation, New Taipei (TW)

( * ) Notice: Subject to any disclaimer, the term of this patent is extended or adjusted under 35 U.S.C. 154(b) by 10 days.

(21) Appl. No.: 13/366,742

(22) Filed: Feb. 6, 2012

(65) Prior Publication Data

US 2013/0049812 A1 Feb. 28, 2013

Related U.S. Application Data

(60) Provisional application No. 61/528,830, filed on Aug. 30, 2011.

(51) Int. Cl.
*H03B 1/00* (2006.01)
*H03K 3/00* (2006.01)

(52) U.S. Cl.
USPC ............ 327/108; 327/109; 327/110; 327/112

(58) Field of Classification Search
USPC .......................................... 327/108, 109, 112
See application file for complete search history.

(56) References Cited

U.S. PATENT DOCUMENTS 6,975,146 B1 * 12/2005 Schottler ....................... 327/108

* cited by examiner

*Primary Examiner* — John Poos
(74) *Attorney, Agent, or Firm* — McClure, Qualey & Rodack, LLP

(57) ABSTRACT

A high-side switch control circuit is provided. The high-side switch control circuit includes an on/off transistor, a bias resistor, a zener diode, a level-shifting transistor, and a current source. The on/off transistor operates as a switch. The bias resistor is coupled to turn off the on/off transistor. The zener diode is coupled to clamp the maximum voltage of the on/off transistor. The level-shifting transistor is coupled to turn on the on/off transistor. The current source is coupled to the level-shifting transistor. The current source limits the maximum current of the level-shifting transistor.

6 Claims, 2 Drawing Sheets

US 8,531,210 B2

MONOLITHIC HIGH-SIDE SWITCH CONTROL CIRCUITS

CROSS REFERENCE TO RELATED APPLICATIONS

This application claims the benefit of U.S. Provisional Application No. 61/528,830, filed on Aug. 30, 2011, the contents of which are incorporated herein by reference.

BACKGROUND OF THE INVENTION

1. Field of the Invention

The present invention provides a control circuit, and more particularly to a control circuit for high-side switches.

2. Description of the Related Art

The present invention provides a control circuit for controlling high-side switches. The circuit is developed in a monolithic integrated circuit. It can be applied to circuits of battery management, circuits of battery cell balance, light-emitting diode (LED) backlight drivers and power converters.

BRIEF SUMMARY OF THE INVENTION

An embodiment of a high-side switch control circuit comprises an on/off transistor, a bias resistor, a zener diode, a level-shifting transistor, and a current source. The on/off transistor operates as a switch. The bias resistor is coupled to turn off the on/off transistor. The zener diode is coupled to clamp a maximum voltage of the on/off transistor. The level-shifting transistor is coupled to turn on the on/off transistor. The current source is coupled to the level-shifting transistor. The current source limits a maximum current of the level-shifting transistor.

Another exemplary embodiment of a high-side switch control circuit comprises an on/off transistor, a bias resistor, a zener diode, a level-shifting transistor, and a resistor. The on/off transistor operates as a switch. The bias resistor is coupled to turn off the on/off transistor. The zener diode is coupled to clamp a maximum voltage of the on/off transistor. The level-shifting transistor is coupled to turn on the on/off transistor. The resistor is coupled to a source terminal of the level-shifting transistor. A gate voltage of the level-shifting transistor is regulable, and the resistor limits a maximum current of the level-shifting transistor.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
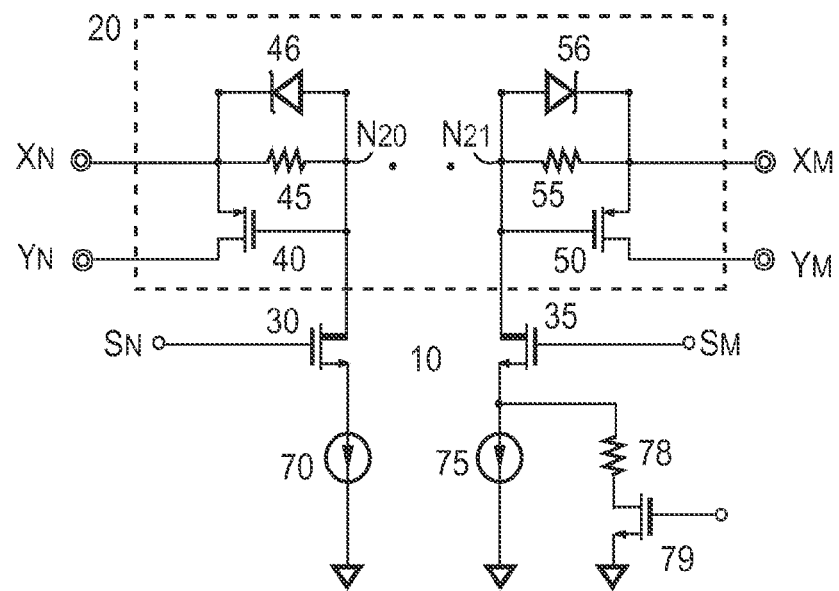
FIG. 1 shows one embodiment of a control circuit according to the present invention.

FIG. 1 shows one embodiment of a control circuit according to the present invention. The control circuit is used to control high-side switches. Referring to FIG. 1, the control circuit includes a first circuit 10 which is developed in a P silicon substrate silicon of an integrated circuit. The control circuit further includes a second circuit 20 which is developed in an isolated well that is formed in the P silicon substrate.

Referring to FIG. 1, the first circuit 10 includes level-shifting transistors 30 and 35, current sources 70 and 75, a low-impedance resistor 78, and a low-impedance transistor 79. The second circuit 20 includes on/off transistors 40 and 50 operated as switches, bias resistors 45 and 55, and zener diodes 46 and 56. The gate terminal of the on/off transistor 40 is coupled to a node $N_{20}$, the source thereof is coupled to a terminal $X_N$, and the drain terminal thereof is coupled to a terminal $Y_N$. The on/off transistor 40 is coupled to turn on/off the terminals $X_N$ and $Y_N$. The gate terminal of the on/off transistor 50 is coupled to a node $N_{21}$, the source terminal thereof is coupled to a terminal $X_M$, and the drain terminal thereof is coupled to a terminal $Y_M$. The transistor 50 is coupled to turn on/off the terminals $X_M$ and $Y_M$. The on/off transistor 40 is controlled by the level-shifting transistor 30 which is developed in the first circuit 10, and in detailed, the on/off transistor 40 is turned on by the level-shifting transistor 30. The on/off transistor 50 is controlled by the level-shifting transistor 35 which is developed in the first circuit 10, and in detailed, the on/off transistor 50 is turned on by the level-shifting transistor 35. The level-shifting transistors 30 and 35 are controlled by control signals $S_N$ and $S_M$ respectively. The bias resistor 45 is coupled between the terminal $X_N$ and the node $N_{20}$ and coupled to turn off the on/off transistor 40. A zener diode 46 is coupled between the terminal $X_N$ and the node $N_{20}$ and utilized to clamp the maximum voltage applied to the on/off transistor 40. The bias resistor 55 is coupled between the terminal $X_M$ and the node $N_{21}$ and coupled to turn off the on/off transistor 50. The zener diode 56 is coupled between the terminal $X_M$ and the node $N_{21}$ and utilized to clamp the maximum voltage applied to the on/off transistor 50. The current source 70 is coupled with the level-shifting transistor 30 in series to limit the maximum current of the level-shifting transistor 30. In detailed, the gate of the level-shifting transistor 30 receives the control signal $S_N$, the drain terminal thereof is coupled to the node $N_{20}$, and the source terminal thereof is coupled to the current source 70. The current source 75 is coupled with the level-shifting transistor 35 in series to limit the maximum current of the level-shifting transistor 35. In detailed, the gate terminal of the level-shifting transistor 35 receives the control signal $S_M$, the drain terminal thereof is coupled to the node $N_{21}$, and the source terminal thereof is coupled to the current source 75. Therefore, due to the limitation of the maximum currents of the level-shifting transistors 30 and 35, the maximum power consumption of the level-shifting transistors 30 and 35 is regulated. The low-impedance resister 78 is coupled with the low-impedance transistor 79 in series between the source terminal of the level-shifting transistor 35 and a reference low voltage. The low-impedance resistor 78 will be coupled with the current source 75 in parallel once the low-impedance transistor 79 is turned on, which will provide a lower impedance path for turning on the on/off transistor 50 when the voltage of the terminal $X_M$ is low.

Figure 2:
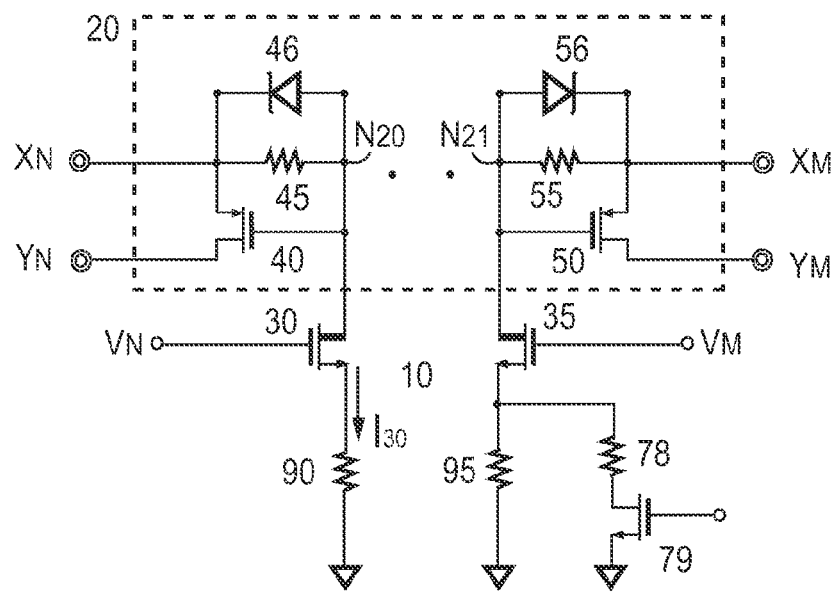
FIG. 2 shows another embodiment of a control circuit according to the present invention.

FIG. 2 shows another embodiment of a control circuit according to the present invention. In the embodiments of FIGS. 1 and 2, the same elements are represented by the same reference labels and perform the same operation so the description is omitted here. The difference between the control circuits of the FIGS. 1 and 2 is that the control circuit of FIG. 2 includes resistors 90 and 95 which are applied to replace the current sources 70 and 75 shown in FIG. 1 to limit the maximum currents of the level-shifting transistors 30 and 35, respectively. Moreover, the level-shifting transistors 30 and 35 are controlled by control voltages $V_N$ and $V_M$ replacing the control signals $S_N$ and $S_M$ shown in FIG. 1, respectively. The control voltages $V_N$ and $V_M$ are regulated. In other words, the gate voltages of the level-shifting transistors 30 and 35 are regulated. Thus, the current of the level-shifting transistor 30 will be regulated.

$$I_{30}=(V_N-V_{GS})/R_{90}$$

where the $I_{30}$ is the current of the level-shifting transistor 30, $V_{GS}$ is the threshold voltage of the level-shifting transistor 30, and the $R_{90}$ is the resistance of the resistor 90.

According to the present invention, the control circuits of FIGS. 1 and 2 can be applied to circuits of battery management, circuits of battery cell balance, LED backlight driver, and power converters. Therefore, due to the limitation of the maximum currents of the level-shifting transistors 30 and 35, the maximum power consumption of the level-shifting transistors 30 and 35 is regulated.

Figure 3:
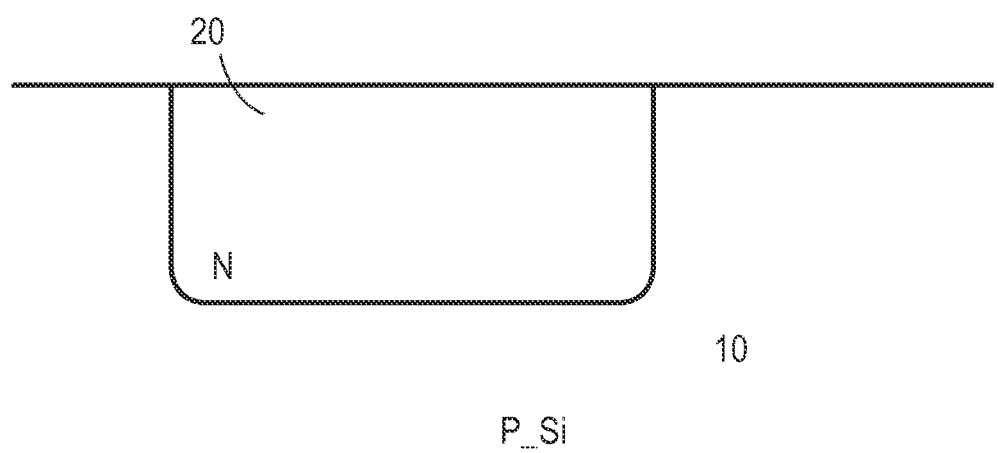
FIG. 3 shows an embodiment for a monolithic integrated circuit according to the present invention.

FIG. 3 shows an embodiment for a monolithic integrated circuit according to the present invention. Referring to FIG. 3, the first circuit 10 shown in FIGS. 1 and 2 is developed in a P silicon substrate (P_Si). The elements of the second circuit 20 shown in FIGS. 1 and 2 are developed in an isolated N well (N). The second circuit 20 is isolated from the first circuit 10.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A monolithic high-side switch control circuit comprising:
   an on/off transistor operated as a switch;
   a bias resistor coupled to turn off the on/off transistor;
   a zener diode coupled to clamp a maximum voltage of the on/off transistor;
   a level-shifting transistor coupled to turn on the on/off transistor; and
   a current source coupled to the level-shifting transistor;
   wherein the current source limits a maximum current of the level-shifting transistor;
   wherein the level-shifting transistor is located in a first circuit, the on/off transistor is located in a second circuit, and the second circuit is developed in an isolated well and isolated from the first circuit.

2. The monolithic high-side switch control circuit as claimed in claim 1, wherein the first circuit is developed in a P silicon substrate.

3. The monolithic high-side switch control circuit as claimed in claim 1 further comprising:
   a low-impedance resistor coupled to the current source; and
   a low-impedance transistor coupled with the low-impedance resistor in series;
   wherein the current source is coupled with the low-impedance resistor in parallel once the low-impedance transistor is turned on.

4. A monolithic high-side switch control circuit comprising:
   an on/off transistor operated as a switch;
   a bias resistor coupled to turn off the on/off transistor;
   a zener diode coupled to clamp a maximum voltage of the on/off transistor;
   a level-shifting transistor coupled to turn on the on/off transistor; and
   a resistor coupled to a source terminal of the level-shifting transistor;
   wherein a gate voltage of the level-shifting transistor is regulated, and the resistor limits a maximum current of the level-shifting transistor;
   wherein the level-shifting transistor is located in a first circuit, the on/off transistor is located in a second circuit, and the second circuit is developed in an isolated well and isolated from the first circuit.

5. The monolithic high-side switch control circuit as claimed in claim 4, wherein the first circuit is developed in a P-silicon substrate.

6. The monolithic high-side switch control circuit as claimed in claim 4 further comprising:
   a low-impedance resistor coupled to the resistor;
   a low-impedance transistor coupled with the low-impedance resistor in series;
   wherein the resistor is coupled with the low-impedance resistor in parallel once the low-impedance transistor is turned on.

* * * * *